United States Patent [19]
Hardy

[11] Patent Number: 5,258,711
[45] Date of Patent: Nov. 2, 1993

[54] NMR SELECTIVE EXCITATION OF BENT SLICES

[75] Inventor: Christopher J. Hardy, Schenectady, N.Y.

[73] Assignee: General Electric Company, Schenectady, N.Y.

[21] Appl. No.: 871,154

[22] Filed: Apr. 20, 1992

[51] Int. Cl.$^5$ ............................................. G01R 33/20
[52] U.S. Cl. .................................................... 324/309
[58] Field of Search ............... 324/300, 307, 309, 310, 324/311, 312, 313, 314, 318, 322

[56] References Cited

U.S. PATENT DOCUMENTS

| | | | |
|---|---|---|---|
| 4,707,659 | 11/1987 | Kunz et al. | 324/309 |
| 4,746,864 | 5/1988 | Satoh | 324/309 |
| 4,840,700 | 6/1989 | Edelstein et al. | 156/634 |
| 4,926,125 | 5/1990 | Roemer et al. | 324/309 |
| 4,940,941 | 7/1990 | Rzedzian | 324/312 |
| 4,947,119 | 8/1990 | Ugurbil et al. | 324/307 |
| 5,019,778 | 5/1991 | Mens et al. | 324/322 |

OTHER PUBLICATIONS

O. M. Mueller, et al., 10th Annual Meeting of Soc. of Mag. Reson. in Med., p. 130, San Francisco, CA (1991).
"A k-space Analysis of Small-Tip-Angle Excitation", by J. Pauly, et al, J. Magn. Reson. 81, 43-56 (1989).
"Correcting for Nonuniform k-space Sampling in Two-Dimensional NMR Selective Excitation", by C. J. Hardy, et al., J. Magn. Reson 87, 639-45 (1990).

Primary Examiner—Michael J. Tokar
Attorney, Agent, or Firm—Lawrence P. Zale; Marvin Snyder

[57] ABSTRACT

A method for reducing distortion in magnetic resonance (MR) images of a subject employs distortion compensating MR pulses in a conventional MR imaging sequence. The distortion compensating pulses are determined by first creating a conventional MR image of a slice of a subject having inherent distortions; constructing a target slice which is distorted in a manner opposite the direction of distortions in the slice image; taking a multi-dimensional Fourier transformation of the target slice to obtain a k-space region; choosing a continuous trajectory which efficiently traverses the k-space region; applying principles of multidimensional selective-excitation design to create simultaneous RF pulses and magnetic field gradient waveforms from the trajectory; and simultaneously applying the RF pulses and gradient waveforms in place of a traditional slice-select pulse in conventional MR imaging sequences to obtain images having reduced distortion as compared with conventional images.

17 Claims, 11 Drawing Sheets

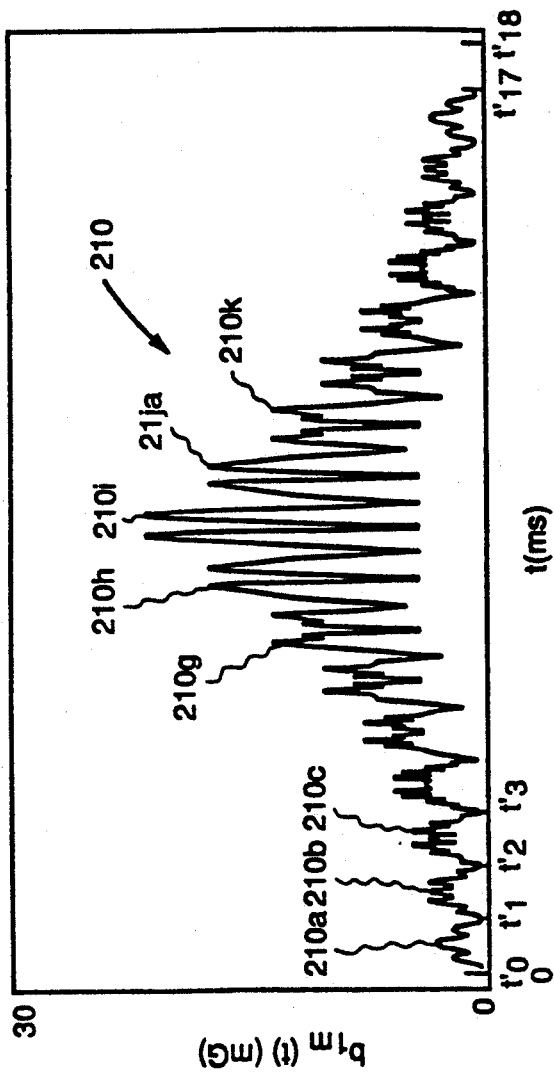
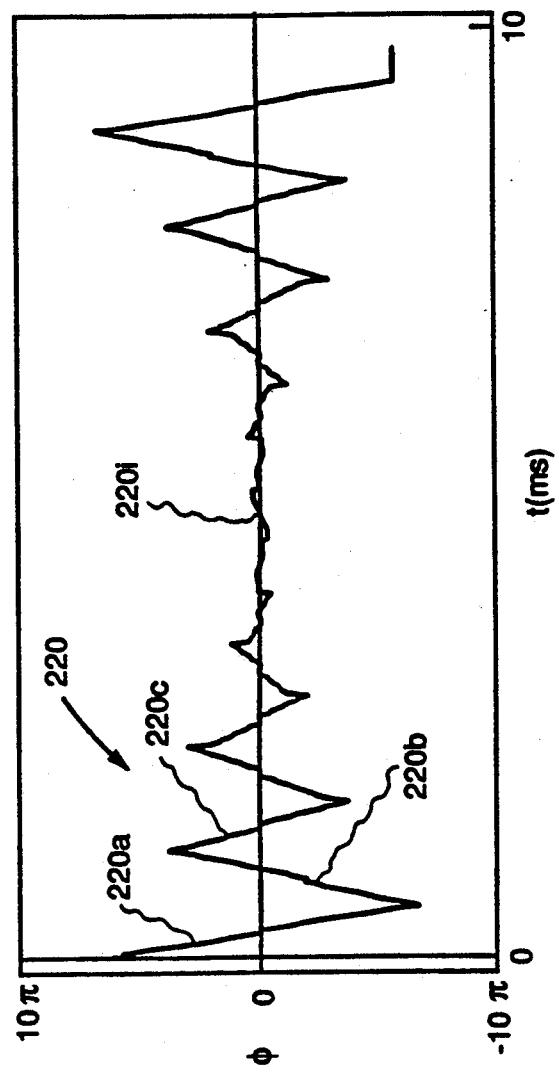
FIG. 8a
FIG. 8b

NMR SELECTIVE EXCITATION OF BENT SLICES

BACKGROUND OF THE INVENTION

1. Field of the Invention

The present application relates to nuclear magnetic resonance (NMR) imaging, and more particularly to a novel method of NMR imaging using bent slices in order to correct inherent slice distortion.

2. Description of Related Art

To perform NMR imaging it is necessary to produce gradients, or linear variations across space, in a static magnetic field, $B_0$. This is achieved by pulsing current through coils designed to create such variations. If these applied gradients are not perfectly linear, distortions can result in an acquired NMR image. In NMR imaging, magnetic field gradients and radiofrequency energy are applied to a subject to be imaged causing a portion of the subject to resonate and enter an excited nuclear spin state. In many types of imaging, the excited portion has a planar or slice shape having a small thickness. The distortions induced by non-linear magnetic field gradients may occur both within the plane of the image (a readout direction and a phase-encoding direction), and in a direction through the plane or slice. Recent developments in gradient coil design have improved gradient linearity to some extent as described in U.S. Pat. No. 4,840,700 Current Streamline Method for Coil Construction issued to William A. Edelstein and John F. Schenck on Jun. 29, 1989 and assigned to the present assignee. Nevertheless, significant warping of the image can still occur. Novel gradient coils which trade linearity for speed or patient access can exacerbate this problem as described in U.S. Pat. No. 4,926,125 Surface Gradient Assembly for High Speed Nuclear Magnetic Resonance Imaging issued to Peter B. Roemer on May 15, 1990 and assigned to the present assignee. Distortions in the image in the readout and phase-encoding directions can be corrected by post-processing of the image, such as interpolating the image onto a non-distorted grid. Conventional techniques for correcting warped images after they have been acquired, correct only distortions within the image plane and cannot be used to straighten the slice itself, in the absence of contiguous slices. It is therefore desirable to provide a method for selecting an undistorted slice in the presence of nonlinear static-magnetic-field gradients in order to reconstruct an undistorted image.

OBJECTS OF THE INVENTION

An object of the invention is to reduce distortion in a magnetic resonance (MR) image introduced by nonlinearities in the static-magnetic-field gradients.

It is another object of the present invention to provide a novel method for selecting planar slices in MR imaging in the presence of nonlinearities inherent in applied static-magnetic-field gradients.

BRIEF SUMMARY OF THE INVENTION

In accordance with the invention, distortion is reduced in an MR image by selecting a pre-distorted slice which is distorted in a manner opposite to the distortion incurred by inhomogeneities inherent in magnetic field gradients of the MR imaging system. The pre-distorted slice is selected by simultaneous application of a radio frequency (RF) excitation pulse, and magnetic field gradient pulses. The parameters of RF excitation pulse and magnetic field gradient pulses are determined by first constructing a target slice which is distorted in a manner opposite to the distortions caused by gradient nonlinearities. A multi-dimensional Fourier transformation of the constructed profile is taken which results in a Fourier space region. A single continuous trajectory representing magnetic field gradient pulses over time is chosen which traverses most of the Fourier space region. The continuous trajectory is processed according to the principles of multidimensional selective-excitation design to create simultaneous gradient and RF pulse waveforms. These waveforms are applied in place of traditional slice-select pulse waveforms in an NMR imaging pulse sequence to create an image with reduced distortion.

In one presently preferred embodiment, the trajectory is a bowtie-shaped radial trajectory of limited angular extent used to design the two-dimensional (2D) selective excitation pulse waveforms.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

FIG. 8a is a graph of the amplitude of an RF pulse over time derived from the trajectory of FIG. 7.

FIG. 8b is a graph of the phase over time of the RF pulse of FIG. 8a.

DETAILED DESCRIPTION OF THE INVENTION

Figure 1:
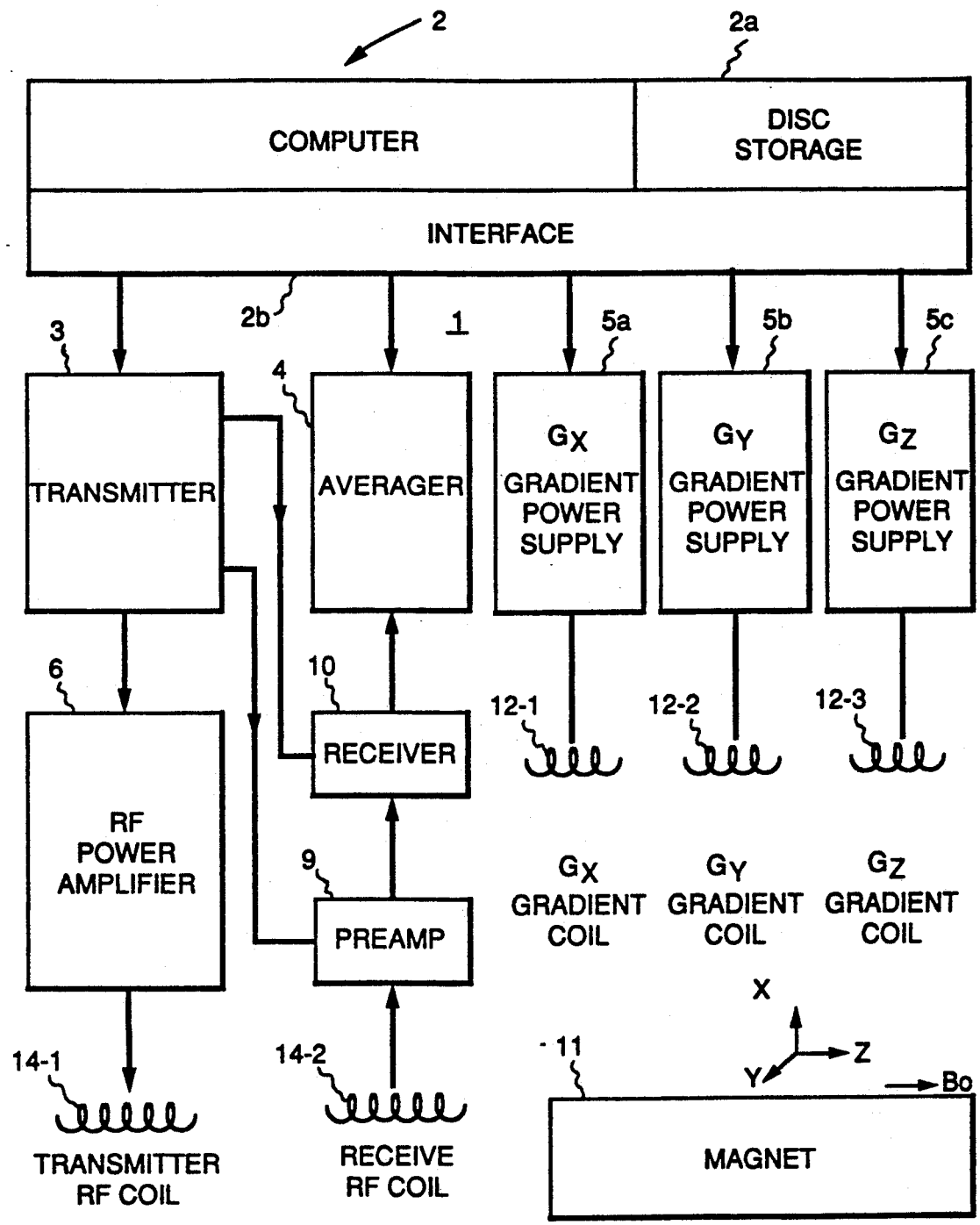
FIG. 1 is a block diagram of a magnetic resonance (MR) imaging system suitable for use with the method of the present invention.

FIG. 1 is a simplified block diagram of the major components of a magnetic resonance (MR) imaging system suitable for use with the invention described herein. The system 1 is made up of a general purpose mini-computer 2 which is functionally coupled to a disk storage unit 2a and an interface unit 2b. An RF transmitter 3, signal averager 4, and gradient power supplies 5a, 5b and 5c, are all coupled to computer 2 through interface unit 2b. Gradient power supplies 5a, 5b, 5c energize gradient coils 12-1, 12-2, 12-3 to create magnetic field gradients $G_x$, $G_y$, $G_z$, in the "X", "Y", "Z" directions, respectively, over a subject to be imaged. RF transmitter 3 is gated with pulse envelopes from computer 2 to generate RF pulses having the required modulation to excite an MR response signal from a subject. The RF pules are amplified in an RF power amplifier 6 to levels varying from 100 watts to several kilowatts, depending on the imaging method, and applied to a transmitter coil 14-1. The higher power levels are necessary for large sample volumes, such as in whole body imaging, and where short duration pulses are required to excite larger NMR frequency bandwidths.

The MR response signal is sensed by a receiver coil 14-2, amplified in a low noise preamplifier 9 and passed to receiver 10 for further amplification, detection, and filtering. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transforms, image reconstruction, data filtering, imaging display, and storage functions (all of which are conventional and outside the scope of the present invention).

Transmitter coil 14-1 and receiver RF coil 14-2, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field $B_0$ produced by a magnet means 11. The coils may be isolated from the remainder of the system by enclosure in an RF shielded cage.

Figure 2:
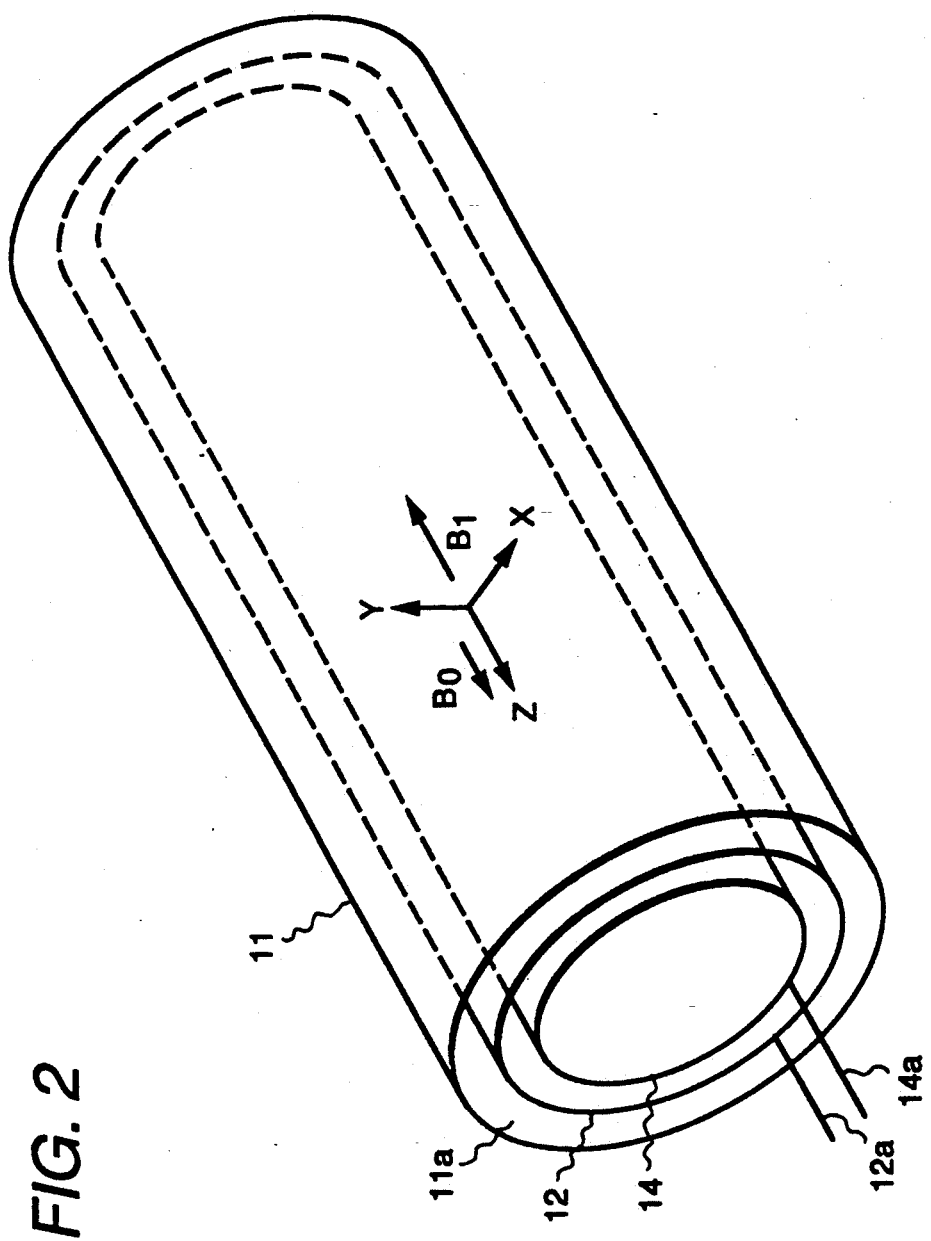
FIG. 2 is a perspective schematic view of the MR imaging magnet, gradient coils, and RF coils of FIG. 1.

Magnetic field gradient coils 12-1, 12-2, and 12-3 are necessary to provide gradients $G_x$, $G_y$, and $G_z$, respectively, as monotonic and linear over the sample volume. Multivalued gradient fields cause a degradation in the MR response signal data, known as aliasing, which leads to severe image artifacts. Nonlinear gradients cause geometric distortions of the image. Main magnet 11, shown schematically detail in FIG. 2, has a central cylindrical bore 11a which generates a static magnetic field $B_0$, typically in the axial, or Z Cartesian coordinate direction. A set of coils 12, such as coils 12-1, 12-2, 12-3 of FIG. 1 receive electrical signals via input connections 12a, and provide at least one gradient magnetic field within the volume of bore 11a. Also situated within bore 11a is an RF coil 14, which receives RF energy via at least one input cable 14a, to provide an RF magnetic field $b_1$, typically in the X-Y plane. The use of the coils and magnetic fields shown in FIG. 2 is now well known to those skilled in the MR imaging art.

Figure 3:
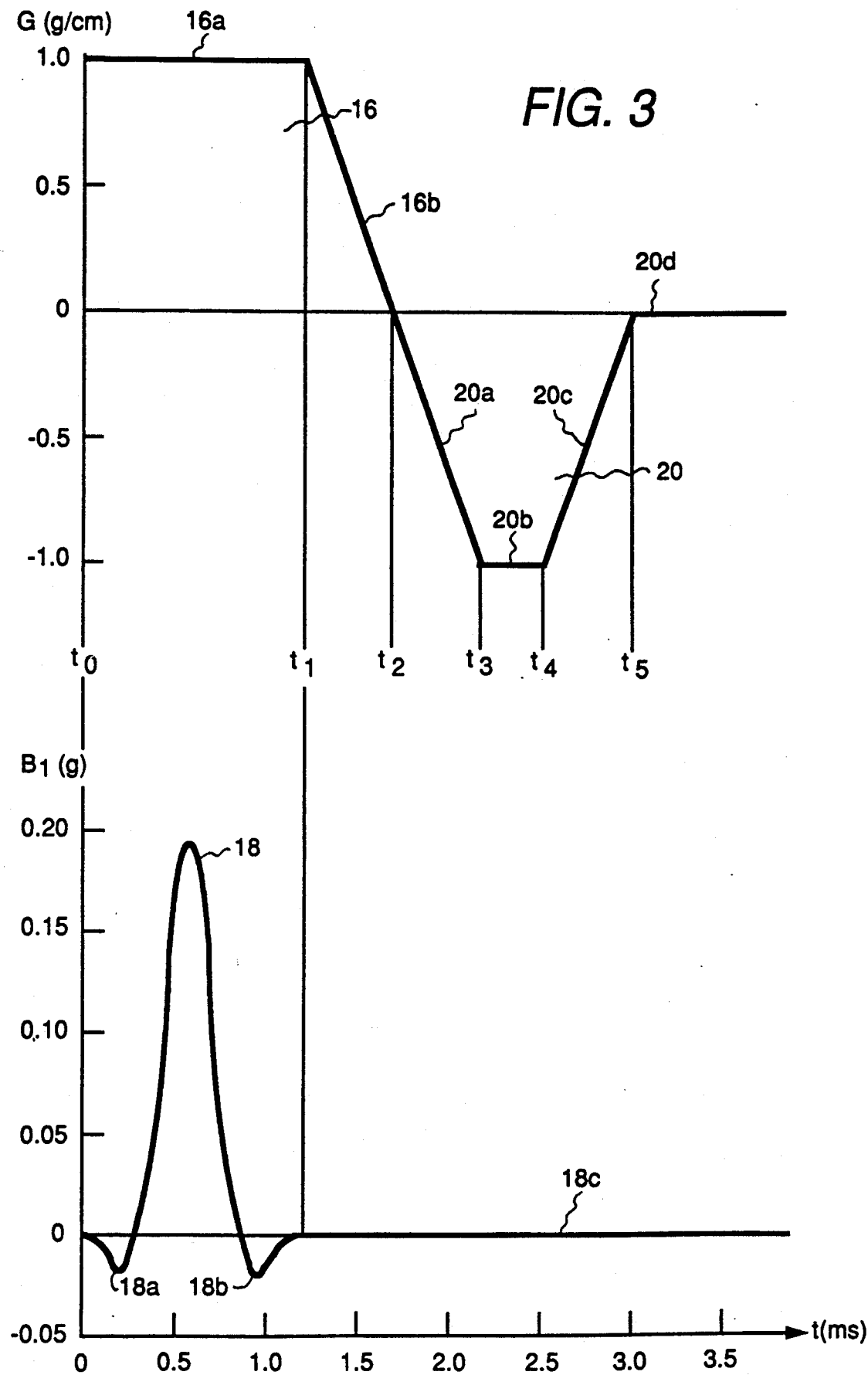
FIG. 3 is a coordinated pair of graphs illustrating a magnetic field gradient pulse and an RF pulse utilized to provide excitation of a slice in a typical MR imaging procedure.

FIG. 3 shows a typical pulse sequence utilized in selectively exciting a slice of the subject being imaged in conventional MRI procedures. The pulse sequence consists of a magnetic field gradient pulse 16 to be applied by gradient coils 12 of FIG. 2, and an RF pulse 18 applied by RF coil 14 of FIG. 2. RF pulse 18 is applied while the substantially-constant amplitude portion 16a of the magnetic field gradient pulse 16 is generated, between initial time $t_0$ and time $t_1$, and can be any selected shape, such as the truncated sin(x)/x RF pulse shown in FIG. 3, with a reduced-amplitude precedent lobe 18a and subsequent lobe 18b. After carrying out the slice-selection task, the RF pulse signal has a substantially constant (substantially zero-amplitude) portion 18c after time $t_1$. Magnetic field gradient pulse 16 is reduced to zero in a finite time (from time $t_1$ to time $t_2$), during portion 16b. The actual slice-selection gradient portion 16 may be followed by a compensation portion 20, of opposite amplitude, and with leading edge 20a (ending at time $t_3$) leading into a substantially constant amplitude portion 20b (ending at time $t_4$), and followed by a trailing edge 20c (ending at time $t_5$ when the zero-amplitude portion 20d is reached).

Figure 4:
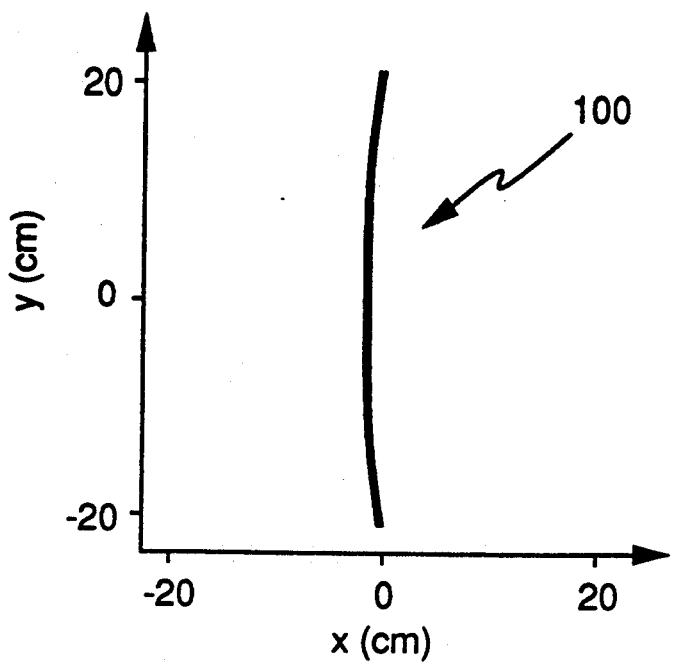
FIG. 4 is a diagram of a 2D slice profile produced by the pulses of FIG. 3, under conditions where the gradient fields are nonlinear.

When magnetic field gradient pulse 16 and RF pulse 18 are applied to the subject under conditions of ideal linear magnetic-field gradients, these pulses causes magnetic resonance, or excitation, in an undistorted planar slice of the subject. This is known as slice selection. However, under conditions of gradients which are not perfectly linear, the pulse can instead select a distorted or bent slice, e.g. slice 100 shown in 2 dimensions (X, Y) in FIG. 4. A two-dimensional example is explained here for illustrative purposes but can easily be extended to cover three-dimensional distortion.

In order to correct the distortion introduced by nonlinear gradients a pre-distorted slice, or target slice or profile, is selected by application of an RF pulse and magnetic field gradient pulse. The target slice is distorted opposite to the distortion incurred by the non-linearity of the magnetic field gradients. The phase and amplitude over time of the RF pulse, along with the "X" direction magnetic field gradient pulse and "Y" direction gradient magnetic field pulse, must be defined to excite the target profile.

Figure 5:
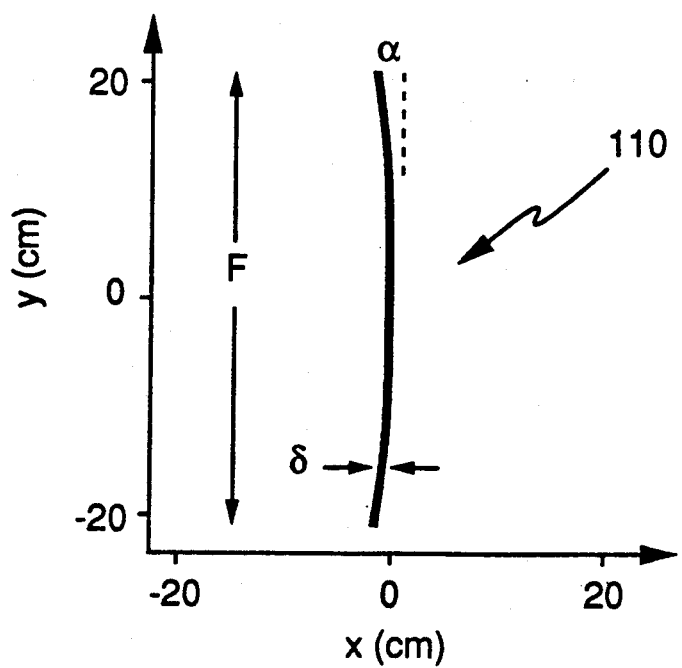
FIG. 5 is a diagram of a 2D target slice designed to have bends opposite to the slice profile of FIG. 4.

A 2D target slice 110, shown in FIG. 5, is constructed to incorporate a bend opposite to that created by nonlinearities in the magnetic-field gradients. Here, $\alpha$ is the degree of bending of the slice, $\delta$ is the slice thickness, and F is the field of view (FOV) of the desired area of the subject to be imaged. MR pulses designed to select target slice 110 on an ideal system will produce an essentially planar slice on a system exhibiting such gradient nonlinearities.

Figure 6:
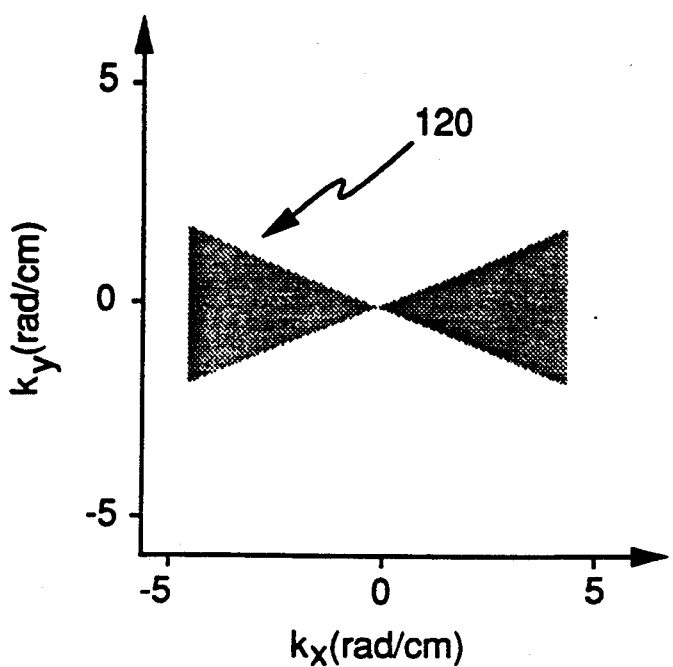
FIG. 6 is a graph of a Fourier space region obtained by performing a 2-dimensional Fourier transform of the target slice shown in FIG. 5.

The RF pulse and magnetic field gradient pulses which will cause a magnetic field gradient in the orthogonal "X" and "Y" directions are derived from target slice 110. First a two-dimensional Fourier transform (2DFT) is performed on the target 2D slice 110 of FIG. 5. This results in a region 120, shown in FIG. 6, having dimensions $k_x$, $k_y$ and known as k-space. k-space region 120 is a bowtie-shaped region centered on the origin. The magnetic field gradient pulse for a gradient in the "X" direction is defined as a time derivative rate of change in the $k_x$ direction of a single linear trajectory chosen to most efficiently and thoroughly cover k-space region 120. Similarly, the magnetic field gradient pulses for a gradient in the "Y" direction is defined as a time derivative rate of change in the $k_y$ direction of the linear trajectory covering k-space region 120.

It is important to keep the total length of this trajectory short, since long trajectories place larger demands on the gradient amplifiers, and result in long pulses of reduced bandwidth. The speed-up circuit described in O. M. Mueller, et al., 10th Annual Meeting of Soc. of Mag. Reson. in Med., p. 130, San Francisco, Calif. (1991) hereby incorporated by reference, may help to create the required gradients.

Figure 7:
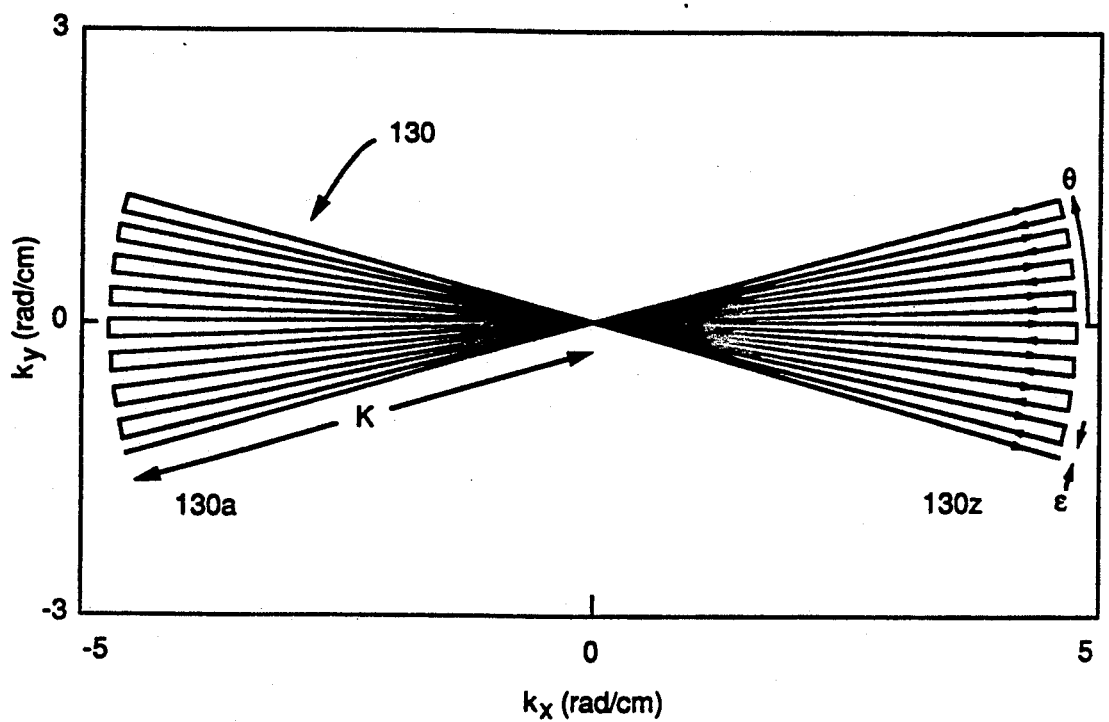
FIG. 7 is a diagram of a trajectory selected to substantially cover the Fourier space region of FIG. 6.

The trajectory chosen in the preferred embodiment is a limited-angle radial trajectory 130 as shown in FIG. 7. Trajectory 130 starts at point 130a, and continues repeatedly through the origin until the end of the trajectory is reached at point 130z. The angular extent $\theta$ of the bowtie is determined by the degree of bending ($\alpha$ in FIG. 5) of the slice, and the radial extent $\kappa$ by the thickness of the slice $\delta$ in FIG. 5. The spacing $\epsilon$ between adjacent lines in the trajectory is inversely proportional to the FOV over which the slice is prescribed (F in FIG. 5), and must be close enough to prevent sampling artifacts from radiating from the slice.

The two orthogonal magnetic field gradient pulses may now be derived by taking the time derivative of motion along the trajectory in 2D k-space. If this trajectory is traversed at a constant linear rate in time, the time derivative results in magnetic field gradient pulses 230 and 240 shown in FIGS. 8c and 8d. As presented in *A k-space Analysis of Small-Tip-Angle Excitation* by J. Pauly, et al., J. Magn. Reson. 81, 43–56 (1989), the magnetic field gradient pulses are expressed as:

$$g_x(t) = \frac{1}{\gamma}\left(\frac{dk_x(t)}{dt}\right)$$

$$g_y(t) = \frac{1}{\gamma}\left(\frac{dk_y(t)}{dt}\right)$$

where $\gamma$ is the nuclear gyromagnetic ratio, t is time, $k_x(t)$ and $k_y(t)$ are the x and y components, respectively, of the position along the k-space trajectory in time, and $g_x(t)$ and $g_y(t)$ are the x and y gradient waveforms, respectively, as a function of time.

The RF amplitude $b_{1m}(t)$ 210 and RF phase $\phi(t)$ 220 are derived by taking the Fourier transformation of the target slice 110 of FIG. 5, sampled by the motion along the trajectory 130, in accordance with principles of 2D selective pulse design.

Principles described in *Correcting for Nonuniform k-space Sampling in Two-dimensional NMR Selective Excitation* by C. J. Hardy, et al., J Magn Reson 87, 639–45 (1990), hereby incorporated by reference, may be used to define the RF pulse by an in-phase component $b_{1I}(t)$, and a quadrature-phase component $b_{1Q}(t)$ according to the following equations:

$$b_{1I}(t) = \quad [1a]$$

$$b_{1Q}(t) = \begin{array}{c} W(t)\int_{-\infty}^{\infty}\int_{-\infty}^{\infty} P_{targ}(x,y)\sin(k_x(t)x + k_y(t)y)dxdy \\ \\ -W(t)\int_{-\infty}^{\infty}\int_{-\infty}^{\infty} P_{targ}(x,y)\cos(k_x(t)x + k_y(t)y)dxdy \end{array} \quad [1b]$$

where:

$$W(t) = \left(\frac{1}{\rho(k_x(t),k_y(t))}\right)\sqrt{g_x(t)^2 + g_y(t)^2} \quad [2]$$

Here x and y are coordinates in space and $P_{targ}(x,y)$ is the target slice 110 of FIG. 5, which is set to 1 for those values of (x,y) falling inside the target slice and 0 for those outside the slice.

The factor $$\frac{1}{\rho(k_x(t),k_y(t))}$$

in Eq. [2] corrects the RF amplitude waveform 210 for the uneven spacing between adjacent lines of a trajectory. This function varies for different trajectories. For trajectory 130 of FIG. 7, this term is expressed as:

$$\frac{1}{\rho(k_x(t),k_y(t))} = \frac{\sqrt{k_x(t)^2 + k_y(t)^2}}{\kappa}, \quad [3a]$$

where $\kappa$ is the outer k-space radius as shown in FIG. 7. For the limited-angle radial trajectory of FIG. 7, the term $$\frac{1}{\rho(k_x(t),k_y(t))}$$

follows Eq [3a] for values of $\sqrt{k_x(t)^2+k_y(t)^2}$ greater than $2\pi/F$ and drops to a constant value of $(2\pi/F)/\kappa$ for values of $\sqrt{k_x(t)^2+k_y(t)^2}$ less than or equal to $2\pi/F$, where F is shown in FIG. 5. This may be expressed as:

$$\frac{1}{\rho(k_x(t),k_y(t))} = \begin{cases} \frac{\sqrt{k_x(t)^2 + k_y(t)^2}}{\kappa}; & \sqrt{k_x(t)^2 + k_y(t)^2} > \frac{2\pi}{F} \\ \frac{(2\pi/F)}{\kappa}; & \sqrt{k_x(t)^2 + k_y(t)^2} \leq \frac{2\pi}{F} \end{cases} \quad [3b]$$

Equations [1a], [1b] and [2] can be expressed in an alternative form to describe the magnitude RF pulse, as:

$$b_{1m}(t) = \sqrt{b_{1I}(t)^2 + b_{1Q}(t)^2} \quad [4a]$$

and phase of the RF pulse as:

$$\phi(t) = \arctan\left(\frac{b_{1Q}(t)}{b_{1I}(t)}\right). \quad [4b]$$

FIG. 8a illustrates the amplitude over time of RF pulse 210 constructed from equation [4a]. RF pulse 210 consists of 17 lobes, starting with lobe 210a, which extends from time $t_0'$ to $t_1'$, followed by lobe 210b, which extends from time $t_2'$ to $t_2'$, then followed by lobe 210c, which extends from time $t_2'$ to $t_3'$, and so on. Each lobe can be multi-modal, with the center lobes 210g, 210h, 210i, 210j, and 210k being largely bimodal. The amplitude of each successive lobe increases until the central lobe 210i is reached, after which the amplitudes of the lobes decreases.

FIG. 8b illustrates the phase over time of RF pulse 220 constructed from equation [4b]. RF pulse 220 consists of 17 ramps of alternating negative and positive slope, beginning with ramps 220a, 220b, and 220c, which correspond to RF lobes 210a, 210b, and 210c, respectively. The amplitude of successive ramps decreases until the central ramp 220i is reached, after which the amplitude increases again.

Figures 8C, 8D:
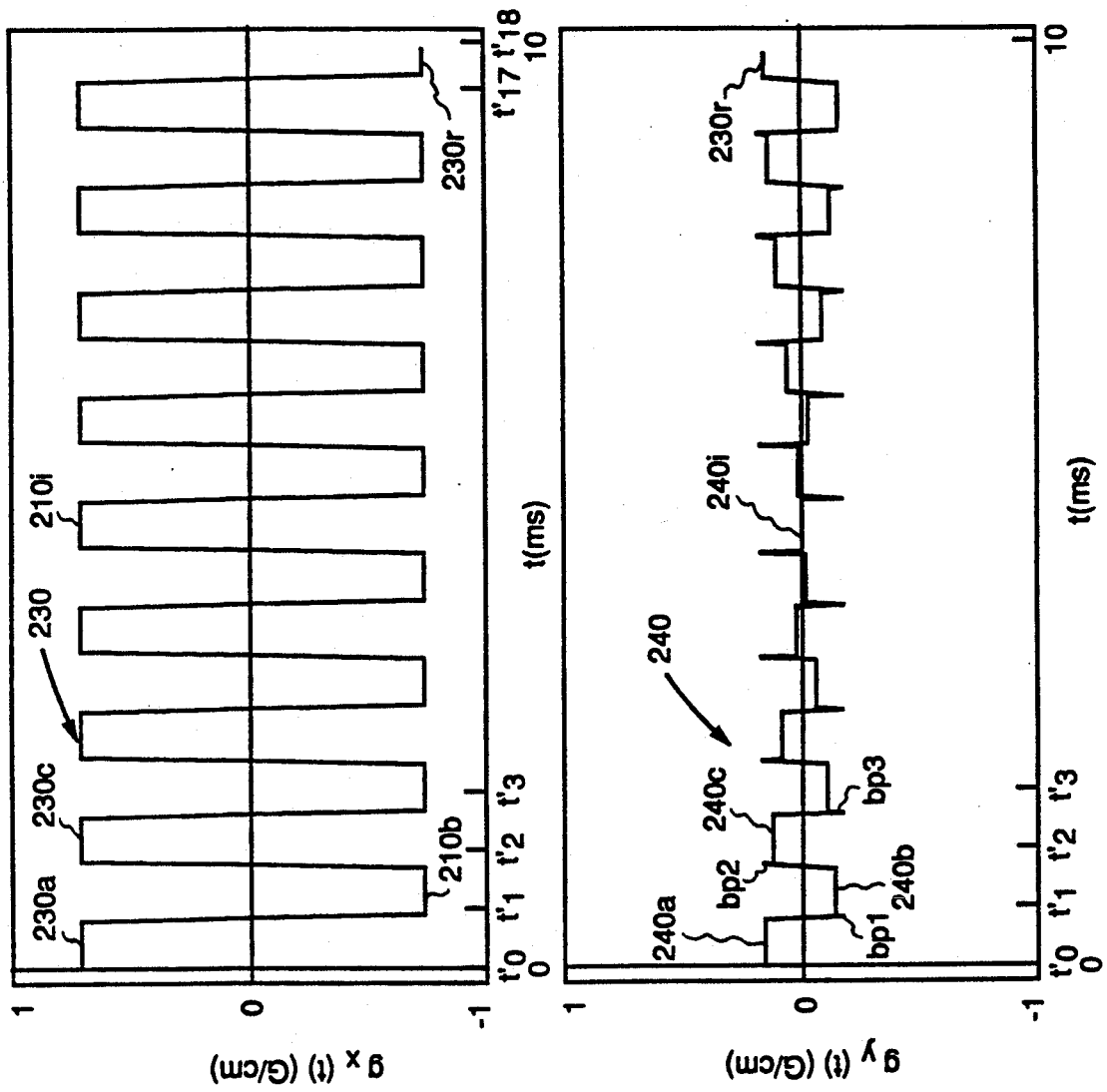
FIG. 8c is a graph of the amplitude of a magnetic field gradient waveform to be applied along an "X" direction over time derived from the trajectory of FIG. 7.
FIG. 8d is a graph of the amplitude of a magnetic field gradient waveform to be applied along a "Y" direction over time derived from the trajectory of FIG. 7.

The "X" gradient waveform 230, shown in FIG. 8c and which consists of alternating positive and negative flat portions starting with portions 230a, 230b, and 230c, is applied concurrently with waveforms 210 and 220 of FIGS. 8a and 8b respectively. The amplitude of successive flat portions increases slightly until the central portion 230i is reached, after which the amplitude decreases. The 17 flat portions are followed by an 18th refocussing flat portion 230r between times $t_{17}'$ and $t_{18}'$. The time period between $t_{17}'$ and $t_{18}'$ is approximately ½ the length of that of any of the preceding segments, $t_0'-t_1'$, $t_1'-t_2'$ . . . .

Gradient waveform 240, as shown in FIG. 8d, is applied concurrently with waveforms 210, 220, and 230. Gradient waveform 240 has a number of alternating positive and negative flat portions, starting with portions 240a, 240b, 240c. The amplitude of successive flat portions decreases until the central portion 240i is reached, after which the amplitude grows again. Between the flat portions are short blips bp1, bp2, bp3 . . . of alternating sign. Following the 17th flat portion is an 18th refocussing flat portion 240r, applied concurrently with portion 230r. The 17 segments of this pulse correspond to the 17 long segments of trajectory 130 of FIG. 7. For trajectories comprising a greater number of segments, there will be a corresponding greater number of segments in the pulse waveforms.

Figure 10:
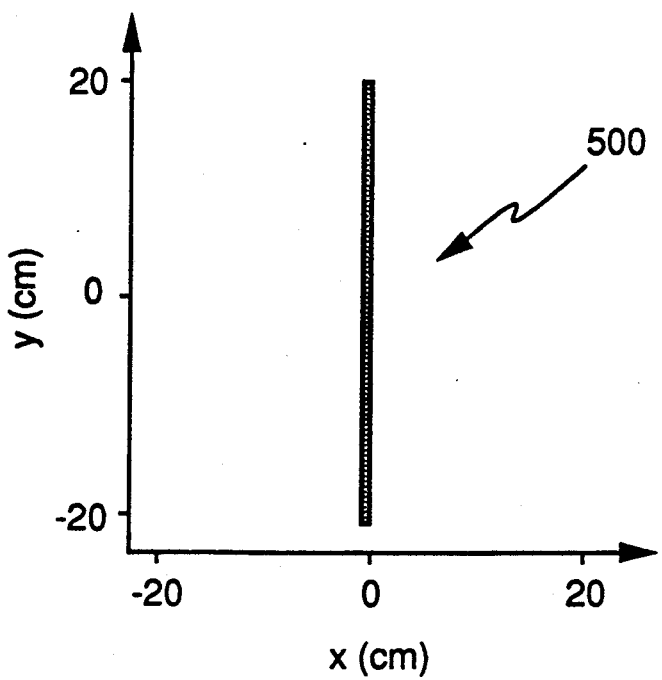
FIG. 10 is a simulation of a 2D slice profile selected by an applied RF pulse of FIGS. 8a and 8b and magnetic field gradient pulses FIGS. 8c and 8d, under conditions of nonlinear gradients as those employed in producing the image of FIG. 4.
Figure 9:
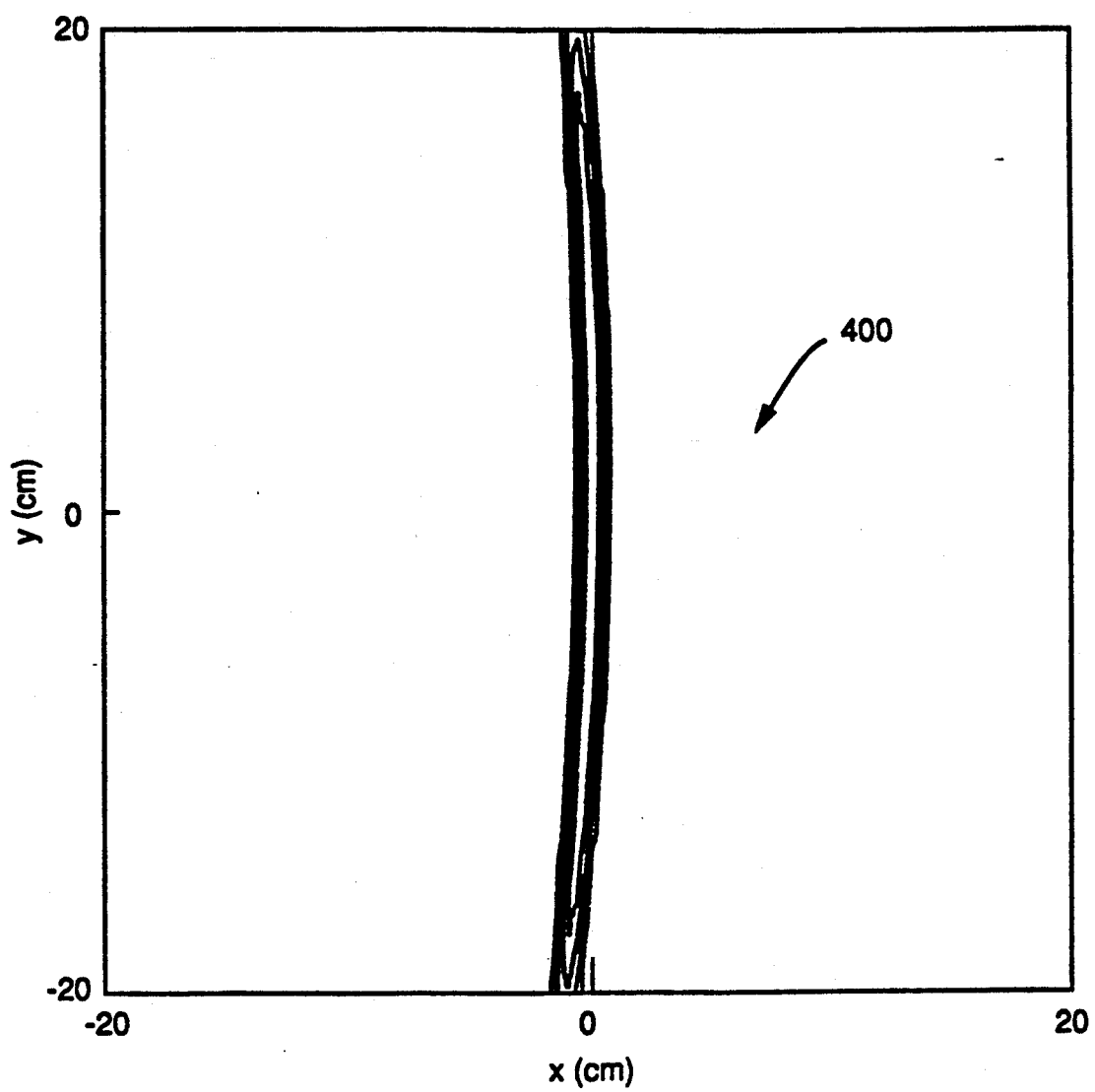
FIG. 9 is a simulated plot of a 2D slice profile selected by an applied RF pulse of FIGS. 8a and 8b and magnetic field gradient pulses FIGS. 8c and 8d, under conditions of ideal linear gradients.

A 2D slice profile excited by the pulse of FIGS. 8a-8d on an ideal system is shown as a simulated plot 400 in FIG. 9. The 2D slice profile obtained for this pulse under the above conditions of nonlinear gradients is shown as slice 500 of FIG. 10. The bent slice 400 of FIG. 9 is thus distorted to a flat slice 500 as shown in FIG. 10. An added advantage of this pulse is that the slice profile drops off outside the FOV, F, in the "Y" dimension, resulting in suppression of aliasing artifacts for subjects larger than the FOV.

For slices bent through different angles α or with different thicknesses δ, the bowtie trajectory will assume different angular θ or radial κ extents, respectively. For slices which bend in opposite directions at either end, it should be possible to cut the bowtie in half, resulting in a shorter pulse.

Other trajectories which cover a bowtie-shaped region efficiently, such as sideways nested "figure 8-shaped", can also be used to excite a target slice.

Figure 11:
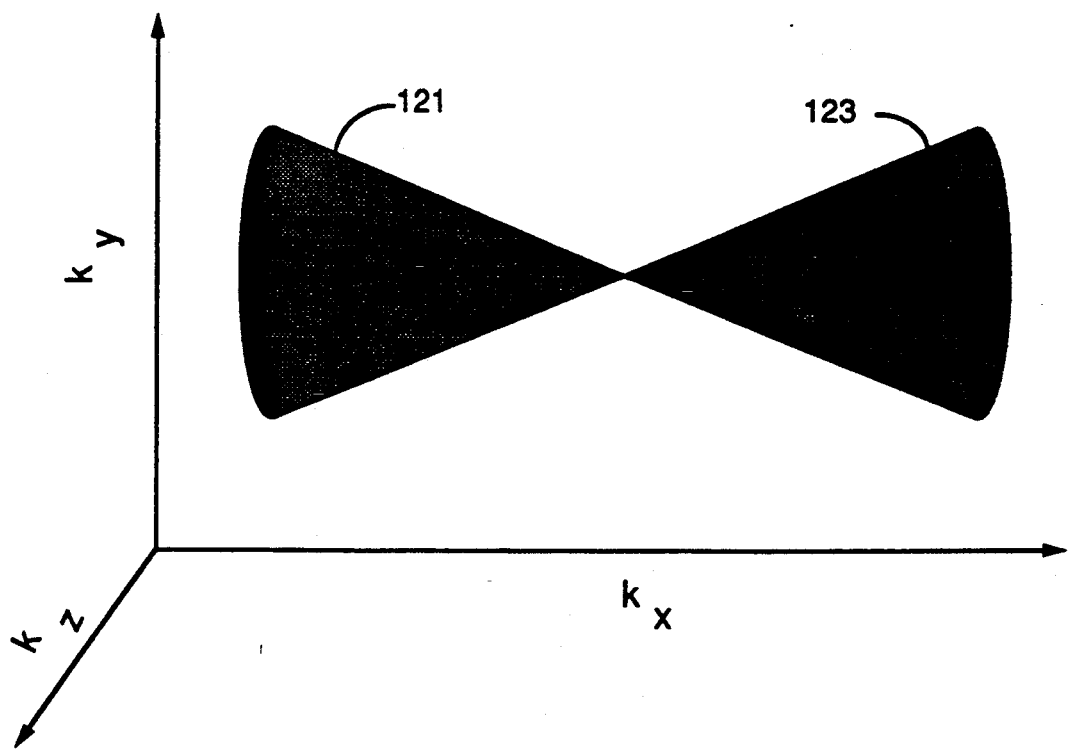
FIG. 11 is a graphic illustration of a three-dimensional Fourier transform volume derived from a mirror-image of a slice distorted in three dimensions.
Figure 12:
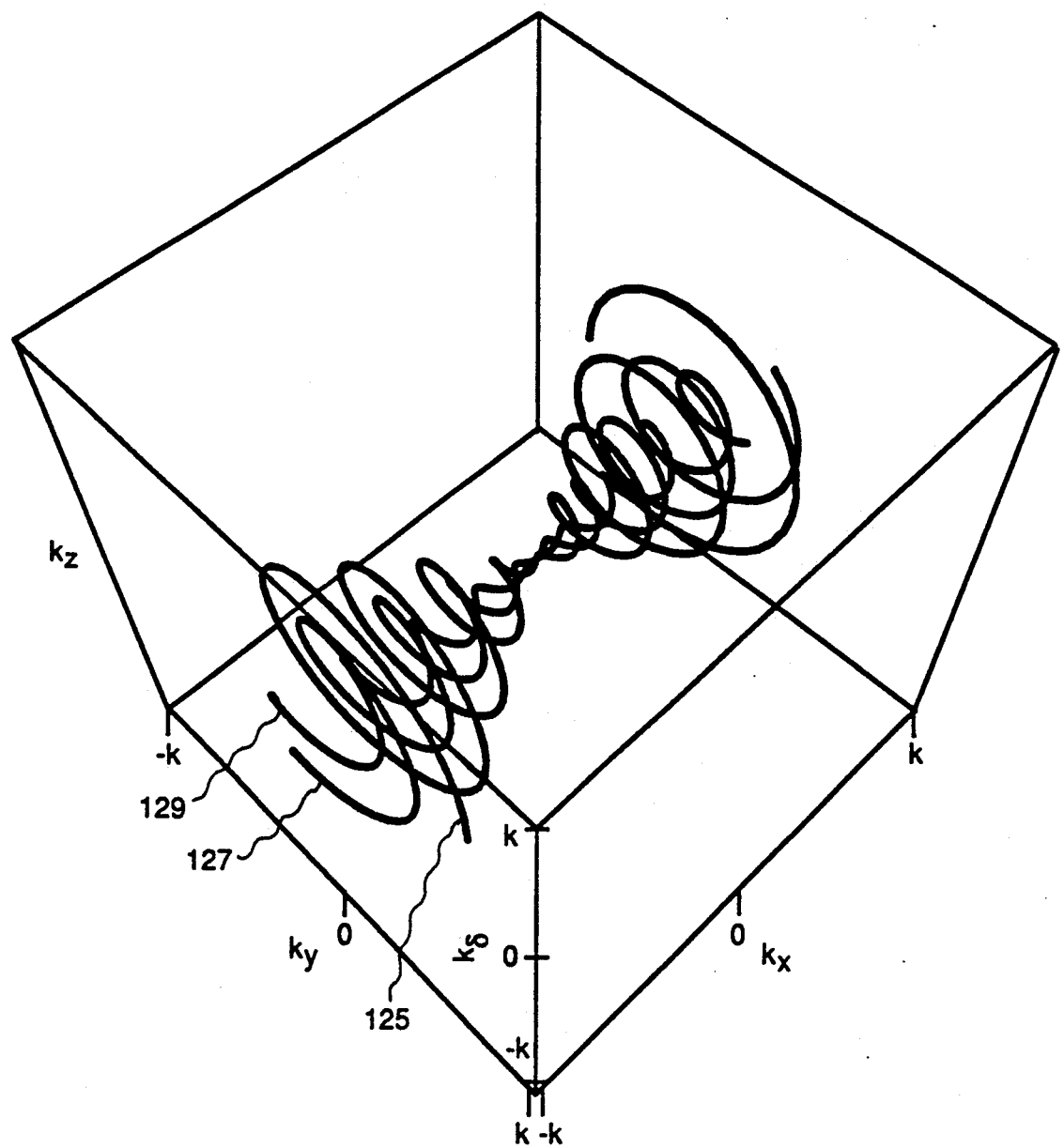
FIG. 12 is a graphic illustration of a trajectory spanning the volume of FIG. 11.

This procedure can also be extended in principle to three dimensions to compensate three-dimensional (e.g. saddle-shaped) slice distortions. FIG. 11 is a three-dimensional Fourier transform of a slice distorted in three dimensions which results in a pair of conical volumes 121 and 123. FIG. 12 illustrates a trajectory comprised of three sub-trajectories 125, 127, 129, each of which traverse roughly spiral conical volumes 121, 123 of k-space. Each sub-trajectory is nested inside the previous one.

The magnetic field gradient pulses used to correct slice distortion in three dimensions are defined by:

$$g_x(t) = \frac{1}{\gamma}\left(\frac{dk_x(t)}{dt}\right) \quad [5a]$$

$$g_y(t) = \frac{1}{\gamma}\left(\frac{dk_y(t)}{dt}\right) \quad [5b]$$

$$g_z(t) = \frac{1}{\gamma}\left(\frac{dk_z(t)}{dt}\right) \quad [5c]$$

for the "X", "Y", "Z" directions respectively.

The RF pulse is defined by an in-phase component $b_{1I}(t)$, and a quadrature-phase component $b_{1Q}(t)$ according to the following equations:

$$b_{1I}(t) = W(t)\int_{-\infty}^{\infty}\int_{-\infty}^{\infty}\int_{-\infty}^{\infty} P_{targ}(x,y,z)\sin\{k_x(t)x + k_y(t)y + k_z(t)z\}dxdydz \quad [6a]$$

$$b_{1Q}(t) = -W(t)\int_{-\infty}^{\infty}\int_{-\infty}^{\infty}\int_{-\infty}^{\infty} P_{targ}(x,y,z)\cos\{k_x(t)x + k_y(t)y + k_z(t)z\}dxdydz \quad [6b]$$

where:

$$W(t) = \left(\frac{1}{\rho(k_x(t),k_y(t),k_z(t))}\right)\sqrt{g_x(t)^2 + g_y(t)^2 + g_z(t)^2} \quad [7]$$

Here x, y, z are coordinates in space and $P_{targ}(x, y, z)$ is a three-dimensional target slice volume, which is set to 1 for those values of (x, y, z) falling inside the target slice volume and 0 for those outside the slice volume.

The factor $$\frac{1}{\rho(k_x(t),k_y(t),k_z(t))}$$

in Eq. [7] depends upon the trajectory employed.

Other trajectories may be used to span the three-dimensional k-space volume such as nested "figure 8-shaped" loops, however, the trajectory employed may be constrained by the bandwidth of the MR imaging apparatus.

While several presently preferred embodiments of our novel invention have been described in detail herein, many modifications and variations will now become apparent to those skilled in the art. It is our intent therefore, to be limited only by the scope of the appending claims and not be the specific details and instrumentalities presented by way of explanation herein.

What we claim is:

1. A method of producing magnetic resonance (MR) images having reduced distortion comprising the steps of:
   a) applying a conventional MR imaging sequence to create an image of a slice of a subject having inherent distortion, the distorted image being bent by an amount $\alpha$, having a thickness $\delta$, and having a field-of view F;
   b) defining a target slice as being a mirror-image shape of the distored image which is distorted in a manner opposite to that of the distorted image;
   c) determining a pair of time-varying magnetic field gradient waveforms $g_x(t)$, $g_y(t)$ that, when applied with a proper radiofrequency (RF) pulse to the subject, will excite the target slice of the subject under conditions of no inherent distortion;
   d) determining a time-varying RF pulse $b_1(t)$ that when applied to the subject with time-varying magnetic field gradient waveforms $g_x(t)$, $g_y(t)$ would excite the target slice of the subject under conditions of no inherent distortion;
   e) simultaneously applying the magnetic field gradient waveforms $g_x(t)$, $g_y(t)$ and the RF pulse $b_1(t)$ to the subject to excite the target slice of the subject;
   f) receiving an MR response signal from the target slice; and
   g) reconstructing a image having reduced distortion from the MR response signal.

2. The method of producing magnetic resonance (MR) images of claim 1 wherein the step of determining a pair of time-varying magnetic field gradient waveforms $g_x(t)$, $g_y(t)$ comprises the steps of:
   a) performing a two-dimensional Fourier transform on the target slice to create a k-space region;
   b) selecting a continuous linear trajectory having a plurality of sub-trajectories which span the k-space region over time and having vector components $k_x(t)$ and $k_y(t)$ in the "X" and "Y" directions respectively;
   c) calculating the time-changing magnetic field gradient waveform $g_x(t)$ in the "X" direction from the continuous linear trajectory according to the following equation:

$$g_x(t) = \frac{1}{\gamma}\left(\frac{dk_x(t)}{dt}\right)$$

where $\gamma$ is the gyromagnetic ratio of the subject being imaged; and
   d) calculating the time-changing magnetic field gradient waveform $g_y(t)$ in the "Y" direction according to the following equation:

$$g_y(t) = \frac{1}{\gamma}\left(\frac{dk_y(t)}{dt}\right).$$

3. The method of producing magnetic resonance (MR) images of claim 2 wherein the step of determining a time-varying RF pulse $b_1(t)$ comprises the steps of:
   a) calculating an in-phase component $b_{1I}(t)$ of the RF pulse $b_1(t)$ according to the equation:

$$b_{1I}(t) = W(t)\int_{-\infty}^{\infty}\int_{-\infty}^{\infty} P_{targ}(x,y)\sin(k_x(t)x + k_y(t)y)dxdy$$

where:
   $P_{targ}(x,y)$ represents the target slice, and is set to 1 for those values of (x,y) falling inside the target slice and 0 for those outside the slice, and $$W(t) = \left(\frac{1}{\rho(k_x(t),k_y(t))}\right)\sqrt{g_x(t)^2 + g_y(t)^2},$$

where $$\rho(k_x(t),k_y(t)) = \frac{1}{\Delta d}$$

and $\Delta d$ is a measure of distance in k-space from a point on a sub-trajectory at time t, to a next closest point on any another sub-trajectory;
   b) calculating a quadrature-phase component $b_{1Q}(t)$ of the RF pulse $b_1(t)$ according to the equation:

$$b_{1Q}(t) = -W(t)\int_{-\infty}^{\infty}\int_{-\infty}^{\infty} P_{targ}(x,y)\cos(k_x(t)x + k_y(t)y)dxdy;$$

c) calculating a time-changing magnitude $b_{1m}(k)$ of the RF pulse $b_1(t)$ according to the equation:

$$b_{1m}(t) = \sqrt{b_{1I}(t)^2 + b_{1Q}(t)^2} \text{ ; and}$$

d) calculating a time-changing phase $\phi(t)$ corresponding to the time-changing magnitude of the RF pulse $b_1(t)$ according to the equation:

$$\phi(t) = \arctan\left(\frac{b_{1Q}(t)}{b_{1I}(t)}\right).$$

4. The method of producing magnetic resonance (MR) images of claim 1 wherein the step of determining a pair of time-varying magnetic field gradient waveforms $g_x(t)$, $g_y(t)$ comprises the steps of:
   a) performing a two-dimensional Fourier transform on the target slice to create a bowtie-shaped region in k-space;
   b) selecting a continuous linear trajectory having a plurality of sub-trajectories which span the k-space region over time and having vector components $k_x(t)$ and $k_y(t)$ in the "X" and "Y" directions respectively;
   c) calculating the time-changing magnetic field gradient waveform $g_x(t)$ in the "X" direction from the continuous linear trajectory according to the following equation:

$$g_x(t) = \frac{1}{\gamma}\left(\frac{dk_x(t)}{dt}\right)$$

where $\gamma$ is the gyromagnetic ratio of the subject being imaged; and
   d) calculating the time-changing magnetic field gradient waveform $g_y(t)$ in the "Y" direction according to the following equation:

$$g_y(t) = \frac{1}{\gamma}\left(\frac{dk_y(t)}{dt}\right).$$

5. The method of producing magnetic resonance (MR) images of claim 4 wherein the step of selecting a continuous linear trajectory comprises selecting a radial trajectory passing through the center of the bow-tie shaped region with a plurality of sub-trajectories, having a distance function $\rho(k_x(t),k_y(t))$ defined by the following equation:

$$\frac{1}{\rho(k_x(t),k_y(t))} = \begin{cases} \frac{\sqrt{k_x(t)^2 + k_y(t)^2}}{\kappa} ; & \sqrt{k_x(t)^2 + k_y(t)^2} > \frac{2\pi}{F} \\ \frac{(2\pi/F)}{\kappa} ; & \sqrt{k_x(t)^2 + k_y(t)^2} \leq \frac{2\pi}{F} \end{cases}$$

and having a radial length $\kappa$, each sub-trajectory being radially spaced from each other by an angle $\epsilon$ covering a total radial angle $2\theta$.

6. The method of producing magnetic resonance (MR) images of claim 5, wherein the angular extent $\theta$ of the sub-trajectories is proportional to the degree of bending $\alpha$ in the target slice.

7. The method of producing magnetic resonance (MR) images of claim 5, wherein the radial length $\kappa$ of each sub-trajectory is inversely proportional to the target slice thickness $\delta$.

8. The method of producing magnetic resonance (MR) images of claim 5, wherein a maximum spacing angle $\epsilon$ between adjacent sub-trajectories is inversely proportional to the field of view F of the target slice.

9. The method of producing magnetic resonance (MR) images of claim 5, further comprising the step of tracing wherein the trajectory at a nonuniform rate.

10. The method of producing magnetic resonance (MR) images of claim 4 wherein the step of selecting a continuous linear trajectory includes the step of selecting each sub-trajectory to have a "figure-8" shape and each successive sub-trajectory to fit within a previous sub-trajectory to span the bowtie-shaped region.

11. A method of producing magnetic resonance (MR) images having reduced distortion comprising the steps of:
    a) applying a conventional MR imaging sequence to create an image of a slice of a subject having inherent distortion, the distorted image being bent by an amount $\alpha$, having a thickness $\delta$, and having a field-of view F;
    b) defining a target slice as being a mirror-image shape of the distorted image which is distorted in a manner opposite to that of the distorted image;
    c) determining a set of time-varying magnetic field gradient waveforms $g_x(t)$, $g_y(t)$, $g_z(t)$ that, when applied with a proper radiofrequency (RF) waveform to the subject, will excite the target slice of the subject;
    d) determining a time-varying RF pulse $b_1(t)$ that when applied to the subject with time-varying magnetic field gradient waveforms $g_x(t)$, $g_y(t)$, $g_z(t)$ would excite the target slice of the subject;
    e) simultaneously applying the magnetic field gradient waveforms $g_x(t)$, $g_y(t)$, $g_z(t)$ and the RF pulse $b_1(t)$ to the subject to excite the target slice of the subject;
    f) receiving an MR response signal from the target slice; and
    g) reconstructing a image having reduced distortion from the MR response signal.

12. The method of producing magnetic resonance (MR) images of claim 11 wherein the step of determining a set of time-varying magnetic field gradient waveforms $g_x(t)$, $g_y(t)$, $g_z(t)$ comprises the steps of:
    a) performing a three-dimensional Fourier transform on the target slice to create a k-space region;
    b) selecting a continuous linear trajectory having a plurality of sub-trajectories which span the k-space region over time and having vector components $k_x(t)$, $k_y(t)$, $k_z(t)$ in the "X", "Y", "Z" directions respectively;
    c) calculating the time-changing magnetic field gradient waveform $g_x(t)$ in the "X" direction from the continuous linear trajectory according to the following equation:

$$g_x(t) = \frac{1}{\gamma}\left(\frac{dk_x(t)}{dt}\right);$$

where $\gamma$ is the gyromagnetic ratio of the subject being imaged;
    d) calculating the time-changing magnetic field gradient waveform $g_y(t)$ in the "Y" direction according to the following equation:

$$g_y(t) = \frac{1}{\gamma}\left(\frac{dk_y(t)}{dt}\right); \text{ and}$$

e) calculating the time-changing magnetic field gradient waveform $g_x(t)$ in the "Z" direction from the continuous linear trajectory according to the following equation:

$$g_z(t) = \frac{1}{\gamma}\left(\frac{dk_z(t)}{dt}\right).$$

13. The method of producing magnetic resonance (MR) images of claim 11 wherein the step of determining a time-varying RF pulse $b_1(t)$ comprises the steps of:
    a) calculating an in-phase component $b_{1I}(t)$ of the RF pulse $b_1(t)$ according to the equation:

$$b_{1I}(t) = W(t)\int_{-\infty}^{\infty}\int_{-\infty}^{\infty}\int_{-\infty}^{\infty} P_{targ}(x,y,z)\sin\{k_x(t)x + k_y(t)y + k_z(t)z\}dxdydz$$

where:
$P_{targ}(x,y,z)$ represents the target slice and is set to 1 for those values of (x, y, z) falling inside the target slice and 0 for those outside of the slice, $$W(t) = \left(\frac{1}{\rho(k_x(t),k_y(t),k_z(t))}\right)\sqrt{g_x(t)^2 + g_y(t)^2 + g_z(t)^2}, \text{ and}$$

where

-continued $$p(k_x(t),k_y(t),k_z(t)) = \frac{1}{\Delta d}$$

and $\Delta d$ is a measure of distance in k-space from a point on a sub-trajectory at time t, to a next closest point on any another sub-trajectory;

b) calculating a quadrature-phase component $b_{1Q}(t)$ of the RF pulse $b_1(t)$ according to the equation:

$$b_{1Q}(t) = -W(t) \int_{-\infty}^{\infty} \int_{-\infty}^{\infty} \int_{-\infty}^{\infty} P_{targ}(x,y,z)\cos\{k_x(t)x + k_y(t)y + k_z z\}dxdydz;$$

c) calculating a time-changing magnitude of the RF pulse $b_1(t)$ according to the equation:

$$b_{1m}(t) = \sqrt{b_{1I}(t)^2 + b_{1Q}(t)^2} \; ; \text{ and}$$

d) calculating a time-changing phase $\phi(t)$ corresponding to the time-changing magnitude of the RF pulse $b_1(t)$ according to the equation:

$$\phi(t) = \arctan\left(\frac{b_{1Q}(t)}{b_{1I}(t)}\right).$$

14. The method of producing magnetic resonance (MR) images of claim 11 wherein the step of determining a set of time-varying magnetic field gradient waveforms $g_x(t)$, $g_y(t)$, $g_z(t)$ comprises the steps of:

a) performing a three-dimensional Fourier transform on the target slice to create a a pair of cone-shaped volumes in k-space, each cone connected to the other at its apex;

b) selecting a continuous linear trajectory having a plurality of sub-trajectories which span the k-space region over time and having vector components $k_x(t)$, $k_y(t)$, $k_z(t)$ in the "X", "Y", "Z" directions respectively;

c) calculating the time-changing magnetic field gradient waveform $g_x(t)$ in the "X" direction from the continuous linear trajectory according to the following equation:

$$g_x(t) = \frac{1}{\gamma}\left(\frac{dk_x(t)}{dt}\right);$$

where $\gamma$ is the gyromagnetic ratio of the subject being imaged;

d) calculating the time-changing magnetic field gradient waveform $g_y(t)$ in the "Y" direction according to the following equation:

$$g_y(t) = \frac{1}{\gamma}\left(\frac{dk_y(t)}{dt}\right); \text{ and}$$

e) calculating the time-changing magnetic field gradient waveform $g_x(t)$ in the "Z" direction from the continuous linear trajectory according to the following equation:

$$g_z(t) = \frac{1}{\gamma}\left(\frac{dk_z(t)}{dt}\right).$$

15. The method of producing magnetic resonance (MR) images of claim 14 wherein the step of selecting a continuous linear trajectory comprises selecting a trajectory having a plurality of sub-trajectories, each sub-trajectory having a spiral cone shape and each successive sub-trajectory fitting into the previous sub-trajectory to span the cone-shaped volumes.

16. The method of producing magnetic resonance (MR) images of claim 14 wherein the step of selecting a continuous linear trajectory includes the step of selecting each sub-trajectory to be a limited-angle radial line segment and each successive sub-trajectory to be rotated through an angle increment in the $k_z$ direction to span the cone-shaped volumes.

17. The method of producing magnetic resonance (MR) images of claim 14 wherein the step of selecting a continuous linear trajectory includes the step of selecting each sub-trajectory to have a "figure-8" shape and each successive sub-trajectory to fit into the previous sub-trajectory to span the cone-shaped volumes.

* * * * *